United States Patent
Fukuda

(10) Patent No.: US 9,230,653 B2
(45) Date of Patent: Jan. 5, 2016

(54) SEMICONDUCTOR MEMORY DEVICE

(71) Applicant: KABUSHIKI KAISHA TOSHIBA, Minato-ku (JP)

(72) Inventor: Ryo Fukuda, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/206,102

(22) Filed: Mar. 12, 2014

(65) Prior Publication Data

US 2015/0070990 A1    Mar. 12, 2015

Related U.S. Application Data

(60) Provisional application No. 61/875,977, filed on Sep. 10, 2013.

(51) Int. Cl.
*G11C 7/10* (2006.01)
*G11C 16/04* (2006.01)
*H01L 27/115* (2006.01)

(52) U.S. Cl.
CPC .......... *G11C 16/0483* (2013.01); *G11C 7/1006* (2013.01); *G11C 7/1012* (2013.01); *G11C 7/1078* (2013.01); *H01L 27/11551* (2013.01); *H01L 27/11578* (2013.01)

(58) Field of Classification Search
CPC ..................................................... G11C 7/1078
USPC ..................................................... 365/189.05
See application file for complete search history.

(56) References Cited

U.S. PATENT DOCUMENTS

| | | | |
|---|---|---|---|
| 6,667,895 B2 * | 12/2003 | Jang et al. | 365/63 |
| 8,372,720 B2 | 2/2013 | Fukuzumi et al. | |
| 2008/0304352 A1 * | 12/2008 | Chen et al. | 365/230.02 |
| 2012/0182804 A1 | 7/2012 | Hung et al. | |

* cited by examiner

*Primary Examiner* — Son Mai

(74) *Attorney, Agent, or Firm* — Oblon, McClelland, Maier & Neustadt, L.L.P.

(57) ABSTRACT

According to an embodiment, a semiconductor device includes an IO terminal unit, an first IO line, and a second IO line. The IO terminal unit includes first and second IO terminals. The first IO line is electrically connected to one of both the first IO terminal and the second IO terminal. The second IO line is electrically connected to the other of both the first IO terminal and the second IO terminal. When the semiconductor device receives a first signal, the first IO terminal is electrically connected to the first IO line and the second IO terminal is electrically connected to the second IO line. When the semiconductor device receives a second signal, the first IO terminal is electrically connected to the second IO line and the second IO terminal is electrically connected to the first IO line. The second signal is different from the first signal.

14 Claims, 14 Drawing Sheets

MUX(OFF) WRITE DATA IN $P_{IO<0>} \longrightarrow L_{IO<0>}\ (D_{IN<0>})$ $P_{IO<1>} \longrightarrow L_{IO<1>}\ (D_{IN<1>})$ $P_{IO<2>} \longrightarrow L_{IO<2>}\ (D_{IN<2>})$ $P_{IO<3>} \longrightarrow L_{IO<3>}\ (D_{IN<3>})$ $P_{IO<4>} \longrightarrow L_{IO<4>}\ (D_{IN<4>})$ $P_{IO<5>} \longrightarrow L_{IO<5>}\ (D_{IN<5>})$ $P_{IO<6>} \longrightarrow L_{IO<6>}\ (D_{IN<6>})$ $P_{IO<7>} \longrightarrow L_{IO<7>}\ (D_{IN<7>})$

FIG. 13

SEMICONDUCTOR MEMORY DEVICE

FIELD

Embodiments described herein relate generally to a semiconductor memory device.

BACKGROUND

Currently, as the applications of a non-volatile semiconductor memory device (memory) are widely expanded, a memory capacity increases.

BRIEF DESCRIPTION OF THE DRAWINGS

FIG. 13 is a diagram for describing a connection state between IO terminals and IO lines when multiplexers are turned off according to the second embodiment;

DETAILED DESCRIPTION

Figure 1:
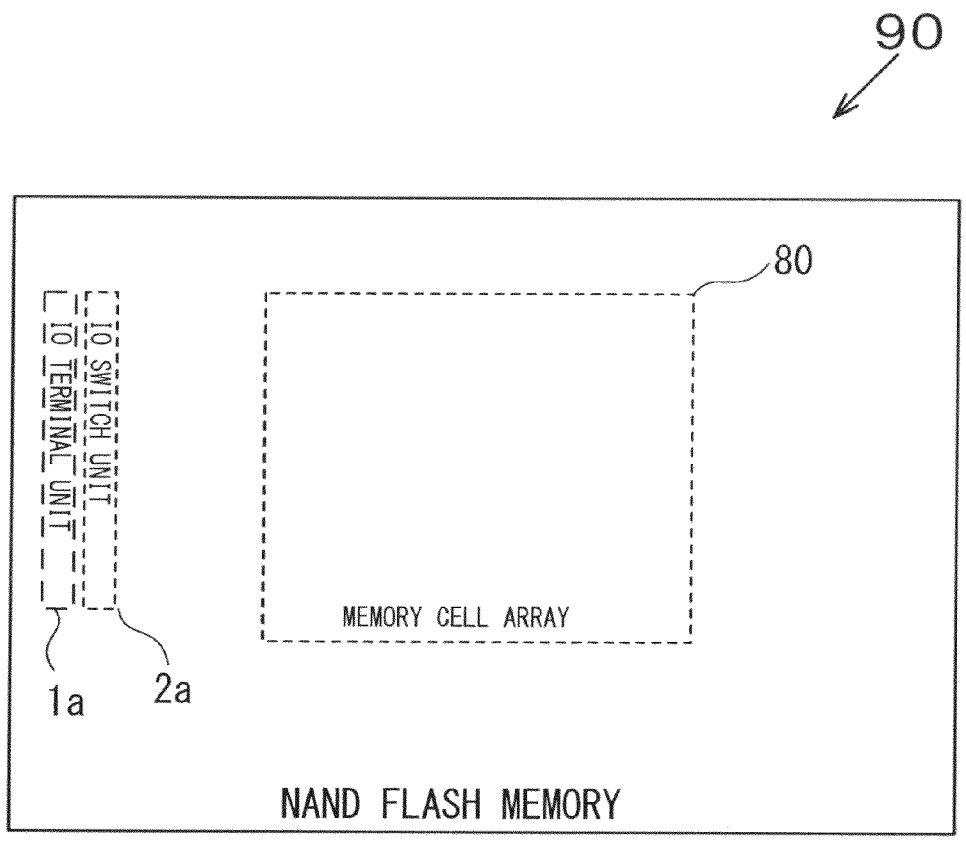
FIG. 1 is a diagram illustrating a schematic configuration of a NAND flash memory according to a first embodiment.

According to an embodiment, a semiconductor device includes an IO terminal unit, an first IO line, and a second IO line. The IO terminal unit includes first and second IO terminals. The first IO line is electrically connected to one of both the first IO terminal and the second IO terminal. The second IO line is electrically connected to the other of both the first IO terminal and the second IO terminal. When the semiconductor device receives a first signal from outside, the first IO terminal is electrically connected to the first IO line and the second IO terminal is electrically connected to the second IO line. When the semiconductor device receives a second signal from outside, the first IO terminal is electrically connected to the second IO line and the second IO terminal is electrically connected to the first IO line. The second signal is different from the first signal.

In the following, a plurality of other examples will be described with reference to the drawings. In the drawings, the same reference numerals will be denoted to the same or similar components.

A semiconductor device to seal the semiconductor memory device (semiconductor memory) includes a single-layered substrate type and a multi-layered substrate type. In the single-layered substrate type, the sequence of the IO terminals becomes different in a case where terminals are disposed in a direction of the short side of a semiconductor memory chip, and in a case where the terminals are disposed in a direction of the long side of the semiconductor memory chip. Therefore, the sequence of the IO terminals may be differently set for every technology node.

In the single-layered substrate type of semiconductor device which seals a semiconductor memory chip and a controller chip, the sequence of the IO terminals is not able to be changed in a case where the semiconductor memory chip and the controller chip are directly connected. Two types of controller chips having different sequences of the IO terminals are necessarily prepared in order to be applied to the semiconductor memory chip.

A semiconductor memory device according to a first embodiment will be described with reference to the drawings. The semiconductor memory device according to the embodiment is a NAND flash memory. FIG. 1 is a diagram illustrating a schematic configuration of the NAND flash memory.

As illustrated in FIG. 1, a NAND flash memory 90 includes an IO terminal unit 1a, an IO switch unit 2a, and a memory cell array 80. The NAND flash memory 90 switches the sequence of the IO lines which are connected between the IO terminals and the memory cell array 80 using the IO switch unit 2a (which will be described in detail below).

The IO terminal unit 1a includes a plurality of IO terminals, and is disposed in the left end of the NAND flash memory 90. The IO switch unit 2a is provided between the IO terminal unit 1a and the memory cell array 80, and disposed in parallel with the IO terminal unit 1a. The memory cell array 80 is disposed in the center of the NAND flash memory 90. The NAND flash memory 90 includes a plurality of memory cell transistors (not illustrated) and a plurality of select transistors and the like (not illustrated).

Figure 2:
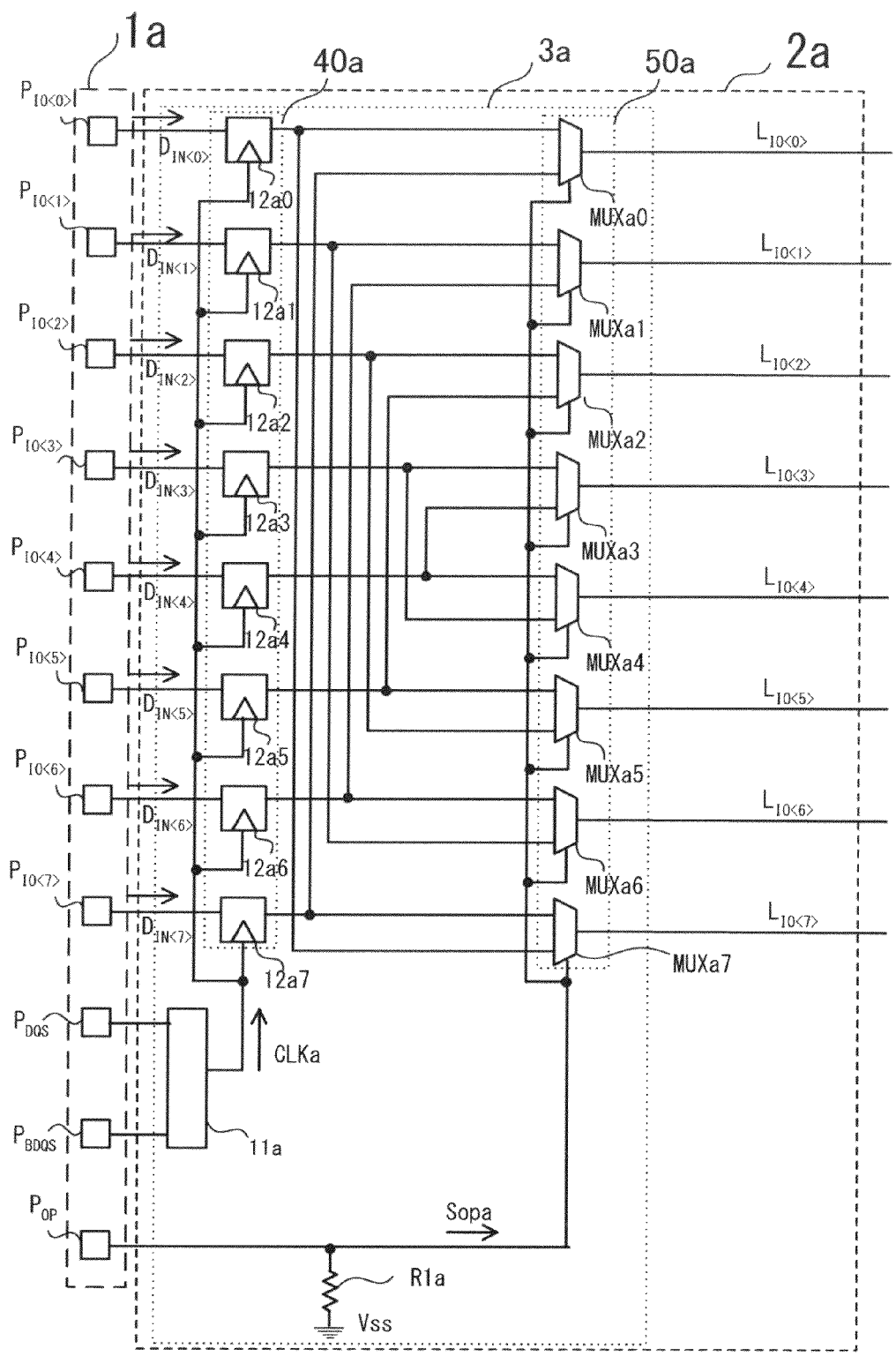
FIG. 2 is a circuit diagram illustrating a configuration of an IO terminal unit and an IO switch unit according to the first embodiment.
Figure 3:
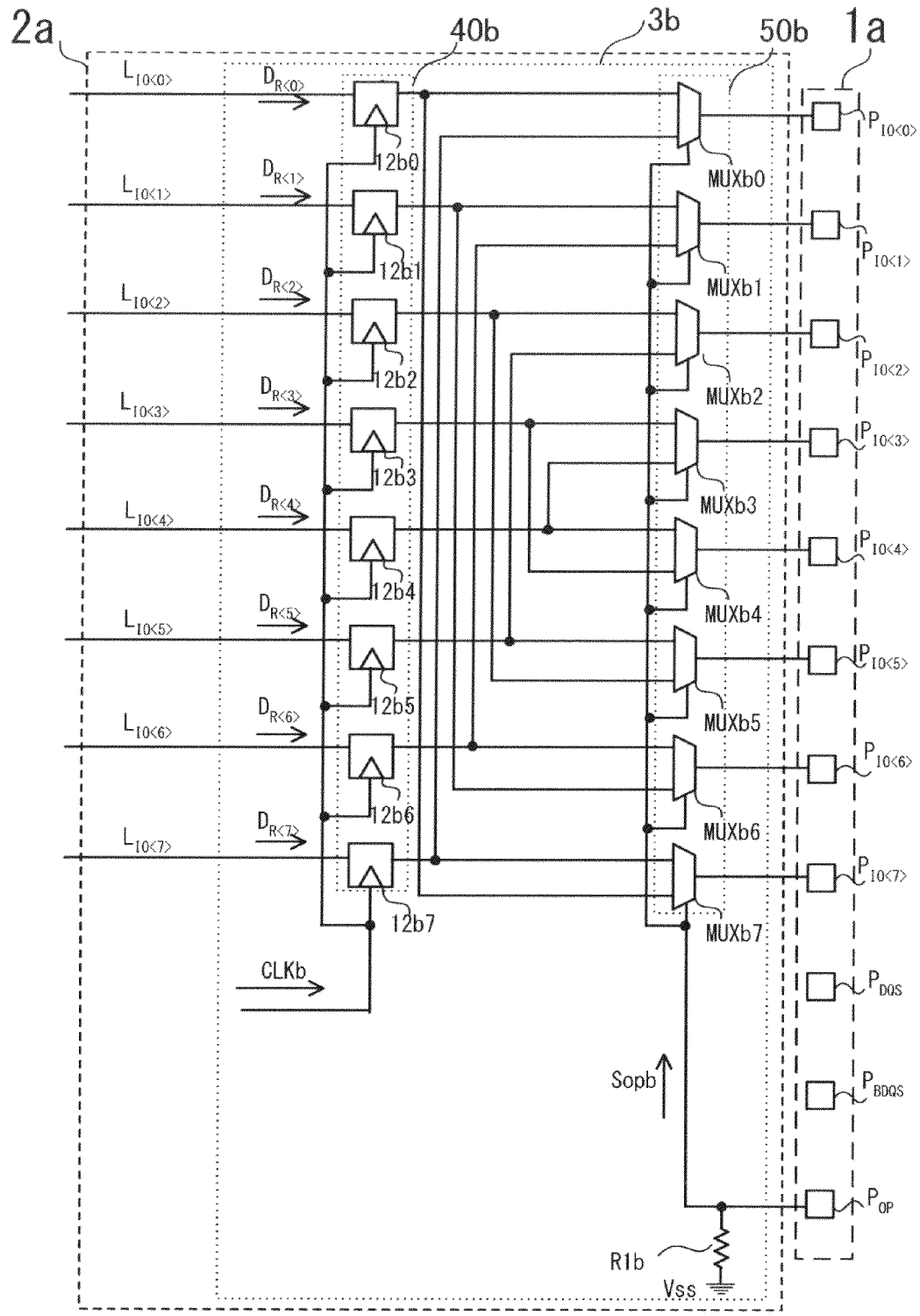
FIG. 3 is a circuit diagram illustrating a configuration of the IO terminal unit and the IO switch unit according to the first embodiment.

The specific configuration of the IO terminal unit and the IO switch unit will be described with reference to FIGS. 2 and 3. FIGS. 2 and 3 are circuit diagrams illustrating the configuration of the IO terminal unit 1a and the IO switch unit 2a. FIG. 2 illustrates the portion corresponding to an input data side, and FIG. 3 illustrates the portion corresponding to an output data side. Herein, the description will be made assuming that the IO terminal unit 1a has eight IO terminals.

As illustrated in FIG. 2, the IO terminal unit 1a includes IO terminals $P_{IO<0>}$ to $P_{IO<7>}$, an input data terminal $P_{DQS}$, an input data terminal $P_{BDQS}$, and a spare terminal $P_{OP}$ (a first terminal). The IO terminals $P_{IO<0>}$ to $P_{IO<7>}$, the input data terminal $P_{DQS}$, the input data terminal $P_{BDQS}$, and the spare terminal $P_{OP}$ (the first terminal) are provided in a line shape, for example. The IO terminals $P_{IO<0>}$ to $P_{IO<7>}$ are used in the NAND flash memory 90 to input or output data, for example. The input data terminal $P_{DQS}$ receives first external data. The input data terminal $P_{BDQS}$ receives second external data.

The IO switch unit 2a includes an IO input switch unit 3a. The IO input switch unit 3a switches the sequence of the input data in accordance with a transfer destination. The IO input switch unit 3a includes a clock generator 11a, a first register unit 40a, a first multiplexer unit 50a, and a resistor R1a. The clock generator 11a generates a first clock CLKa based on the first and second external data.

The first register unit 40a includes registers 12a0 to 12a7 (first to n-th registers). The first register unit 40a is provided between the IO terminals $P_{IO<0>}$ to $P_{IO<7>}$ and the first multiplexer unit 50a. The first multiplexer unit 50a includes multiplexers MUXa0 to MUXa7 (first to n-th multiplexers).

The register 12a0 includes an input side connected to the IO terminal $P_{IO<0>}$, and an output side connected to the multiplexer MUXa0 and the multiplexer MUXa7. The register 12a1 includes an input side connected to the IO terminal $P_{IO<1>}$, and an output side connected to the multiplexer MUXa1 and the multiplexer MUXa6. The register 12a2 includes an input side connected to the IO terminal $P_{IO<2>}$, and an output side connected to the multiplexer MUXa2 and the multiplexer MUXa5. The register 12a3 includes an input side connected to the IO terminal $P_{IO<3>}$, and an output side connected to the multiplexer MUXa3 and the multiplexer MUXa4. The register 12a4 includes an input side connected to the IO terminal $P_{IO<4>}$, and an output side connected to the multiplexer MUXa4 and the multiplexer MUXa3. The register 12a5 includes an input side connected to the IO terminal $P_{IO<5>}$, and an output side connected to the multiplexer MUXa5 and the multiplexer MUXa2. The register 12a6 includes an input side connected to the IO terminal $P_{IO<6>}$, and an output side connected to the multiplexer MUXa6 and the multiplexer MUXa1. The register 12a7 includes an input side connected to the IO terminal $P_{IO<7>}$, and an output side connected to the multiplexer MUXa7 and the multiplexer MUXa0.

The spare terminal $P_{OP}$ (the first terminal) receives a first control signal Sopa from the outside. One end of the resistor R1a is connected to the spare terminal $P_{OP}$, and the other end is applied with a ground voltage Vss. The first control signal Sopa is supplied to the first multiplexer unit 50a.

The multiplexer MUXa0 includes an input side connected to the register 12a0 and the register 12a7, and an output side connected to the IO line $L_{IO<0>}$. The multiplexer MUXa1 includes an input side connected to the register 12a1 and the register 12a6, and an output side connected to the IO line $L_{IO<1>}$. The multiplexer MUXa2 includes an input side connected to the register 12a2 and the register 12a5, and an output side connected to the IO line $L_{IO<2>}$. The multiplexer MUXa3 includes an input side connected to the register 12a3 and the register 12a4, and an output side connected to the IO line $L_{IO<3>}$. The multiplexer MUXa4 includes an input side connected to the register 12a4 and the register 12a3, and an output side connected to the line $L_{IO<4>}$. The multiplexer MUXa5 includes an input side connected to the register 12a5 and the register 12a2, and an output side connected to the IO line $L_{IO<5>}$. The multiplexer MUXa6 includes an input side connected to the register 12a6 and the register 12a1, and an output side connected to the IO line $L_{IO<6>}$. The multiplexer MUXa7 includes an input side connected to the register 12a7 and the register 12a0, and an output side connected to the IO line $L_{IO<7>}$.

When the first clock CLKa is in an enable state (a High level, for example), the register 12a0 latches input data $D_{IN<0>}$ which is input from the IO terminal $P_{IO<0>}$ and then outputs the data. when the first clock CLKa is in the enable state, the register 12a1 latches input data $D_{IN<1>}$ which is input from the IO terminal $P_{IO<1>}$ and then outputs the data. Similarly, when the first clock CLKa is in the enable state, the registers 12a2 to 12a7 latch input data $D_{IN<2>}$ to $D_{IN<7>}$, respectively which are input from the IO terminals $P_{IO<2>}$ to $P_{IO<7>}$, respectively, and then output the data.

The multiplexer MUXa0 includes a first input terminal connected to the output terminal of the register 12a0 and a second input terminal connected to the output terminal of the register 12a7, and selects data of the register 12a0 or the register 12a7 by the first control signal Sopa (at the first level or the second level having a different voltage level from the first level) to output the data to the IO line $L_{IO<0>}$. Herein, in a case where the first level is the High level, the second level becomes a Low level, and in a case where the first level is the Low level, the second level becomes the High level. The multiplexer MUXa1 includes a first input terminal connected to the output terminal of the register 12a1 and a second input terminal connected to the output terminal of the register 12a6, and selects data of the register 12a1 or the register 12a6 by the first control signal Sopa to output the data to the IO line $L_{IO<1>}$. The multiplexer MUXa2 includes a first input terminal connected to the output terminal of the register 12a2 and a second input terminal connected to the output terminal of the register 12a5, and selects data of the register 12a2 or the register 12a5 by the first control signal Sopa to output the data to the IO line $L_{IO<2>}$. The multiplexer MUXa3 includes a first input terminal connected to the output terminal of the register 12a3 and a second input terminal connected to the output terminal of the register 12a4, and selects data of the register 12a3 or the register 12a4 by the first control signal Sopa to output the data to the IO line $L_{IO<3>}$. The multiplexer MUXa4 includes a first input terminal connected to the output terminal of the register 12a4 and a second input terminal connected to the output terminal of the register 12a3, and selects data of the register 12a4 or the register 12a3 by the first control signal Sopa to output the data to the IO line $L_{IO<4>}$. The multiplexer MUXa5 includes a first input terminal connected to the output terminal of the register 12a5 and a second input terminal connected to the output terminal of the register 12a2, and selects data of the register 12a5 or the register 12a2 by the first control signal Sopa to output the data to the IO line $L_{IO<5>}$. The multiplexer MUXa6 includes a first input terminal connected to the output terminal of the register 12a6 and a second input terminal connected to the output terminal of the register 12a1, and selects data of the register 12a6 or the register 12a1 by the first control signal Sopa to output the data to the IO line $L_{IO<6>}$. The multiplexer MUXa7 includes a first input terminal connected to the output terminal of the register 12a7 and a second input terminal connected to the output terminal of the register 12a0, and selects data of the register 12a7 or the register 12a0 by the first control signal Sopa to output the data to the IO line $L_{IO<7>}$.

As illustrated in FIG. 3, the IO switch unit 2a includes an IO output switch unit 3b. The IO output switch unit 3b switches the sequence of the data (output data) read out of memory cells in accordance with an output destination. The IO output switch unit 3b includes a second register unit 40b, a second multiplexer unit 50b, and a resistor R1b.

The second register unit 40b includes registers 12b0 to 12b7 (first to n-th registers). The second multiplexer unit 50b includes multiplexers MUXb0 to MUXb7 (first to n-th multiplexers). The spare terminal $P_{OP}$ (the first terminal) receives a second control signal Sopb from the outside. One end of the resistor R1b is connected to the spare terminal $P_{OP}$, and the other end is applied with the ground voltage Vss. The second control signal Sopb is supplied to the second multiplexer unit 50b.

The register 12b0 includes an input side connected to the IO line $L_{IO<0>}$, and an output side connected to the multiplexer MUXb0 and the multiplexer MUXb7. The register 12b1 includes an input side connected to the IO line $L_{IO<1>}$, and an output side connected to the multiplexer MUXb1 and the multiplexer MUXb6. The register 12b2 includes an input side connected to the IO line $L_{IO<2>}$, and an output side connected to the multiplexer MUXb2 and the multiplexer MUXb5. The register 12b3 includes an input side connected to the IO line $L_{IO<3>}$, and an output side connected to the multiplexer MUXb3 and the multiplexer MUXb4. The register 12b4 includes an input side connected to the IO line $L_{IO<4>}$, and an output side connected to the multiplexer MUXb4 and the multiplexer MUXb3. The register 12b5 includes an input side connected to the IO line $L_{IO<5>}$, and an output side connected to the multiplexer MUXb5 and the multiplexer MUXb2. The register 12b6 includes an input side connected to the IO line $L_{IO<6>}$, and an output side connected to the multiplexer MUXb6 and the multiplexer MUXb1. The register 12b7 includes an input side connected to the IO line $L_{IO<7>}$, and an output side connected to the multiplexer MUXb7 and the multiplexer MUXb0.

The multiplexer MUXb0 includes an input side connected to the register 12b0 and the register 12b7, and an output side connected to the IO terminal $P_{IO<0>}$. The multiplexer MUXb1 includes an input side connected to the register 12b1 and the register 12b6, and an output side connected to the IO terminal $P_{IO<1>}$. The multiplexer MUXb2 includes an input side connected to the register 12b2 and the register 12b5, and an output side connected to the IO terminal $P_{IO<2>}$. The multiplexer MUXb3 includes an input side connected to the register 12b3 and the register 12b4, and an output side connected to the IO terminal $P_{IO<3>}$. The multiplexer MUXb4 includes an input side connected to the register 12b4 and the register 12b3, and an output side connected to the IO terminal $P_{IO<4>}$. The multiplexer MUXb5 includes an input side connected to the register 12b5 and the register 12b2, and an output side connected to the IO terminal $P_{IO<5>}$. The multiplexer MUXb6 includes an input side connected to the register 12b6 and the register 12b1, and an output side connected to the IO terminal $P_{IO<6>}$. The multiplexer MUXb7 includes an input side connected to the register 12b7 and the register 12b0, and an output side connected to the IO terminal $P_{IO<7>}$.

when a second clock CLKb is in the enable state, the register 12b0 latches read-out data $D_{R<0>}$ to be transferred through the IO line $L_{IO<0>}$ and outputs the data. When the second clock CLKb is in the enable state, the register 12b1 latches read-out data $D_{R<1>}$ to be transferred through the IO line $L_{IO<1>}$ and outputs the data. When the second clock CLKb is in the enable state, the register 12b2 latches read-out data $D_{R<2>}$ to be transferred through the IO line $L_{IO<2>}$ and outputs the data. When the second clock CLKb is in the enable state, the register 12b3 latches read-out data $D_{R<3>}$ to be transferred through the IO line $L_{IO<3>}$ and outputs the data. When the second clock CLKb is in the enable state, the register 12b4 latches read-out data $D_{R<4>}$ to be transferred through the IO line $L_{IO<4>}$ and outputs the data. When the second clock CLKb is in the enable state, the register 12b5 latches read-out data $D_{R<5>}$ to be transferred through the IO line $L_{IO<5>}$ and outputs the data. When the second clock CLKb is in the enable state, the register 12b6 latches read-out data $D_{R<6>}$ to be transferred through the IO line $L_{IO<6>}$ and outputs the data. When the second clock CLKb is in the enable state, the register 12b7 latches read-out data $D_{R<7>}$ to be transferred through the IO line $L_{IO<7>}$ and outputs the data.

The multiplexer MUXb0 includes a first input terminal connected to the output terminal of the register 12b0 and a second input terminal connected to the output terminal of the register 12b7, and selects data of the register 12b0 or the register 12b7 by the second control signal Sopb (at the first level or the second level having a different voltage level from the first level) to output the data to the IO terminal $P_{IO<0>}$. Herein, in a case where the first level is the High level, the second level becomes the Low level, and in a case where the first level is the Low level, the second level becomes the High level. The multiplexer MUXb1 includes a first input terminal connected to the output terminal of the register 12b1 and a second input terminal connected to the output terminal of the register 12b6, and selects data of the register 12b1 or the register 12b6 by the second control signal Sopb to output the data to the IO terminal $P_{IO<1>}$. The multiplexer MUXb2 includes a first input terminal connected to the output terminal of the register 12b2 and a second input terminal connected to the output terminal of the register 12b5, and selects data of the register 12b2 or the register 12b5 by the second control signal Sopb to output the data to the IO terminal $P_{IO<2>}$. The multiplexer MUXb3 includes a first input terminal connected to the output terminal of the register 12b3 and a second input terminal connected to the output terminal of the register 12b4, and selects data of the register 12b3 or the register 12b4 by the second control signal Sopb to output the data to the IO terminal $P_{IO<3>}$. The multiplexer MUXb4 includes a first input terminal connected to the output terminal of the register 12b4 and a second input terminal connected to the output terminal of the register 12b3, and selects data of the register 12b4 or the register 12b3 by the second control signal Sopb to output the data to the IO terminal $P_{IO<4>}$. The multiplexer MUXb5 includes a first input terminal connected to the output terminal of the register 12b5 and a second input terminal connected to the output terminal of the register 12b2, and selects data of the register 12b5 or the register 12b2 by the second control signal Sopb to output the data to the IO terminal $P_{IO<5>}$. The multiplexer MUXb6 includes a first input terminal connected to the output terminal of the register 12b6 and a second input terminal connected to the output terminal of the register 12b1, and selects data of the register 12b6 or the register 12b1 by the second control signal Sopb to output the data to the IO terminal $P_{IO<6>}$. The multiplexer MUXb7 includes a first input terminal connected to the output terminal of the register 12b7 and a second input terminal connected to the output terminal of the register 12b0, and selects data of the register 12b7 or the register 12b0 by the second control signal Sopb to output the data to the IO terminal $P_{IO<7>}$.

Figure 4:
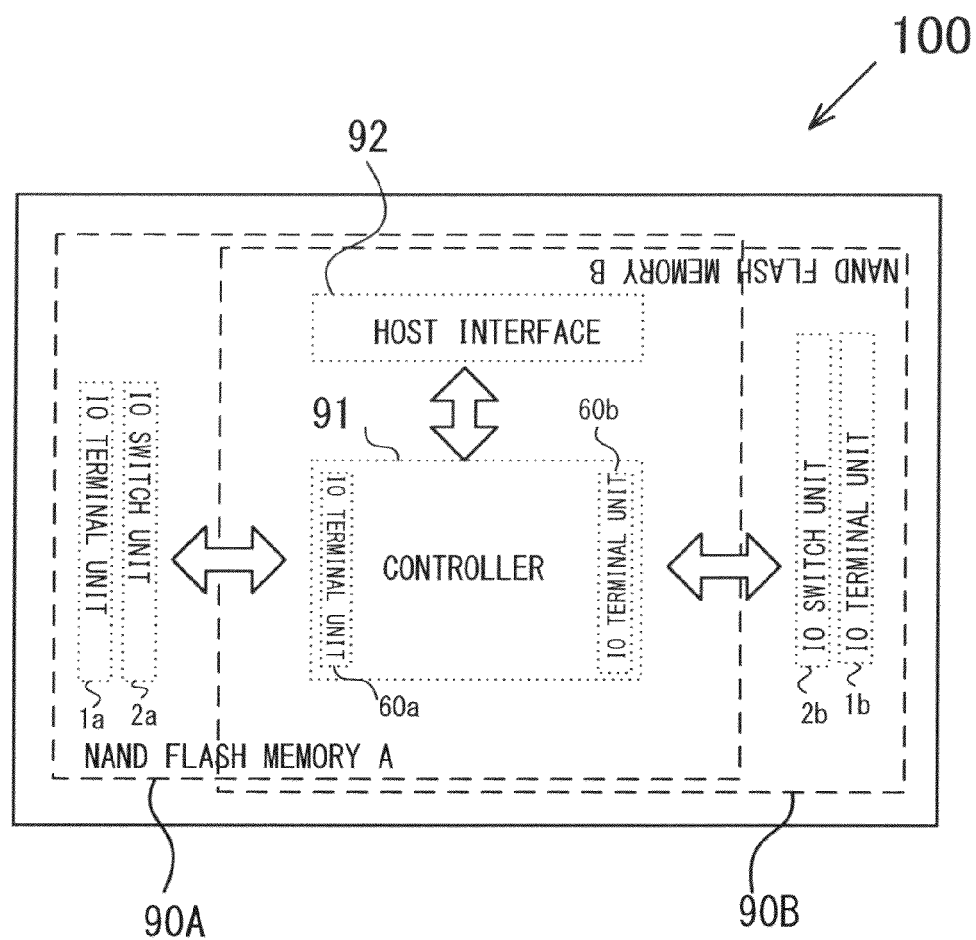
FIG. 4 is a diagram illustrating a configuration of a semiconductor device according to the first embodiment.

Next, the semiconductor device which seals the NAND flash memory according to the embodiment will be described with reference to FIG. 4. FIG. 4 is a diagram illustrating a configuration of the semiconductor device.

As illustrated in FIG. 4, a semiconductor device 100 includes a NAND flash memory 90A, a NAND flash memory 90B, a controller 91, and a host interface 92, all of the NAND flash memory 90A, the NAND flash memory 90B, the controller 91, and the host interface 92 are sealed with resin. The semiconductor device 100 is a ball grid array (BGA) in which the controller 91 and the host interface 92 are provided on the NAND flash memory 90A and the NAND flash memory 90B which are stacked. The NAND flash memory 90A includes the IO terminal unit 1a and the IO switch unit 2a. The NAND flash memory 90B includes an IO terminal unit 1b and an IO switch unit 2b. The controller 91 is placed on the NAND flash memory 90B. The controller 91 includes an IO terminal unit 60a at the left end on the short side, and an IO terminal unit 60b at the right end on the short side. Each of the IO terminal unit 60a and the IO terminal unit 60b is configured by eight IO terminals. The controller 91 delivers data and signals with the NAND flash memory 90A through the IO terminal unit 60a and the IO terminal unit 1a, and delivers data and signals with the NAND flash memory 90B through the IO terminal unit 60b and the IO terminal unit 1b.

In the embodiment, the NAND flash memory 90A is provided with the IO switch unit 2a which can switch the sequence of the IO lines, and the NAND flash memory 90B is provided with the IO switch unit 2b which can switch the sequence of the IO lines. Therefore, even in a case where the IO terminal unit 60a and the IO terminal unit 60b of the controller 91 each are switched in sequence, the data and the signals can be normally delivered.

Figure 5A:
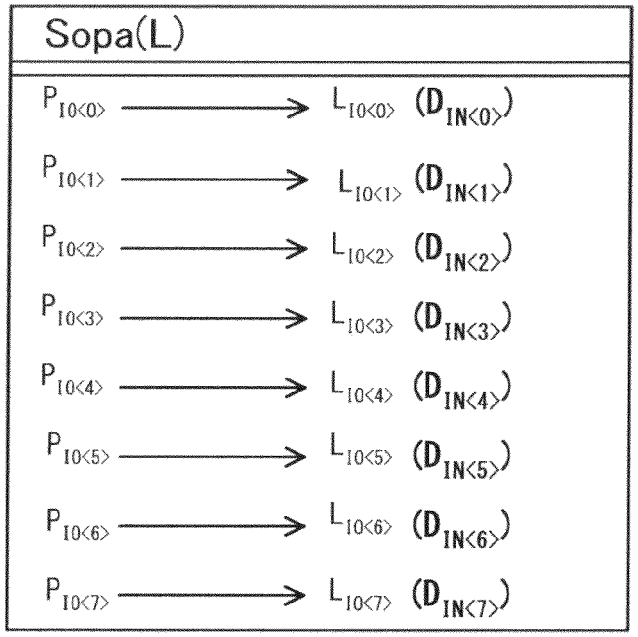
FIG. 5A is a diagram for describing a connection state between IO terminals and IO lines in a case where a first control signal is at a first level.
Figure 5B:
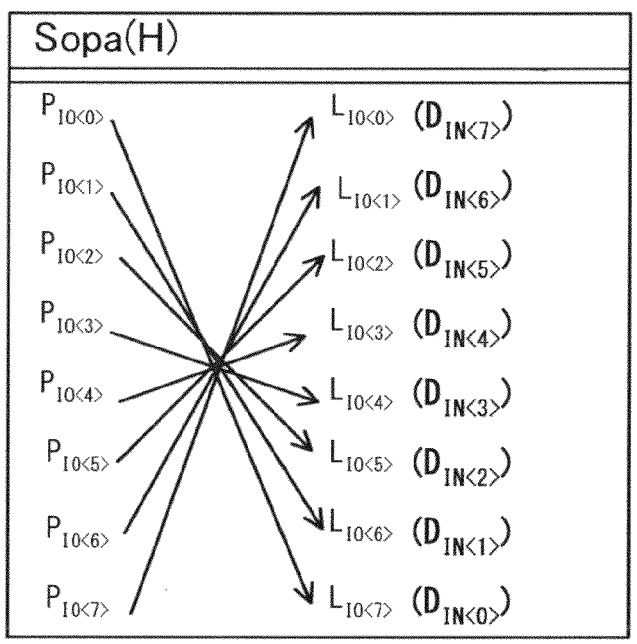
FIG. 5B is a diagram for describing a connection state between the IO terminals and the IO lines in a case where the first control signal is at a second level.
Figure 6A:
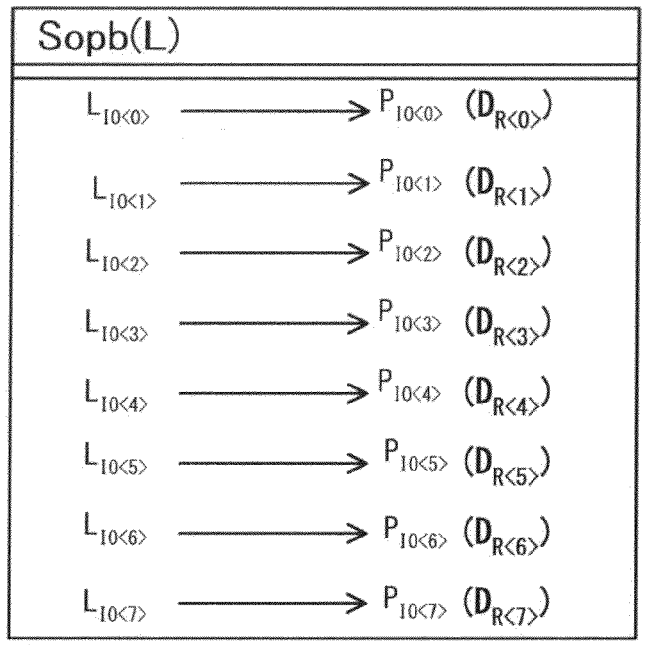
FIG. 6A is a diagram for describing a connection state between the IO terminals and the IO lines in a case where a second control signal is at the first level.
Figure 6B:
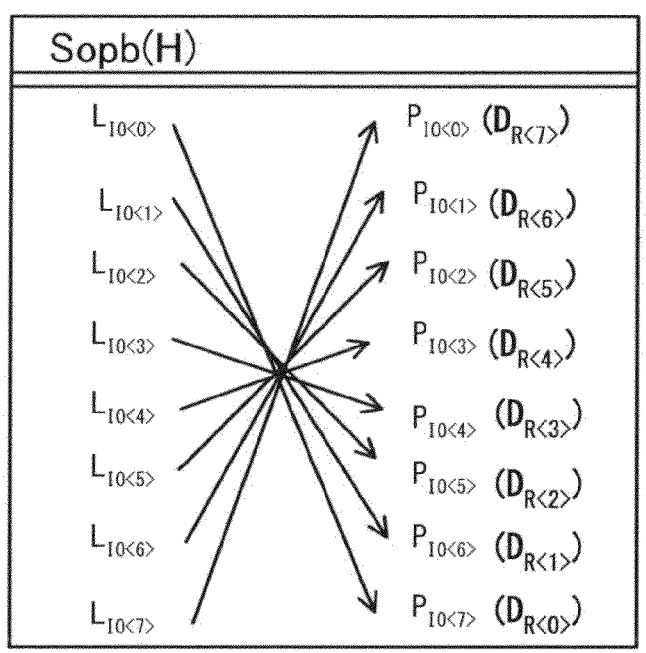
FIG. 6B is a diagram for describing a connection state between the IO terminals and the IO lines in a case where the second control signal is at the second level.

Specifically, the description will be made with reference to FIGS. 5 and 6. FIG. 5A is a diagram for describing a connection state between the IO terminals and the IO lines in a case where the first control signal is at the first level, and FIG. 5B is a diagram for describing a connection state between the IO terminals and the IO lines in a case where the first control signal is at the second level. FIG. 6A is a diagram for describing a connection state between the IO terminals and the IO lines in a case where the second control signal is at the first level, and FIG. 6B is a diagram for describing a connection state between the IO terminals and the IO lines in a case where the second control signal is at the second level.

As illustrated in FIG. 5A, in a case where data is input from the controller 91 to the NAND flash memory 90, the IO terminals $P_{IO<0>}$ to $P_{IO<7>}$ are electrically connected to the IO line $L_{IO<0>}$ to the IO line $L_{IO<7>}$, respectively by the first control signal Sopa at the "Low" level (data selection of the first input terminal of the multiplexer). As a result, the input data $D_{IN<0>}$ to $D_{IN<7>}$ is transferred to the IO lines $L_{IO<0>}$ to $L_{IO<7>}$, respectively. The electrical connection is not limited to a direct connection between the IO terminals $P_{IO<0>}$ to $P_{IO<7>}$ and the IO line $L_{IO<0>}$ to the IO line $L_{IO<7>}$. For example, the electrical connection means that the IO terminals $P_{IO<0>}$ to $P_{IO<7>}$ are connected to the IO line $L_{IO<0>}$ to the IO line $L_{IO<7>}$ through the first register unit 40a and the first multiplexer unit 50a.

As illustrated in FIG. 5B, in a case where data is input from the controller 91 to the NAND flash memory 90, the input data $D_{IN<0>}$ is transferred to the IO line $L_{IO<7>}$, the input data $D_{IN<1>}$ to the IO line $L_{IO<6>}$, the input data $D_{IN<2>}$ to the IO line $L_{IO<5>}$, the input data $D_{IN<3>}$ to the IO line $L_{IO<4>}$, the input data $D_{IN<4>}$ to the IO line $L_{IO<3>}$, the input data $D_{IN<5>}$ to the IO line $L_{IO<2>}$, the input data $D_{IN<6>}$ to the IO line $L_{IO<1>}$, and the input data $D_{IN<7>}$ to the IO line $L_{IO<0>}$, respectively by the first control signal Sopa at the "High" level (data selection of the second input terminal of the multiplexer).

In other words, when the first control signal Sopa is at the first level (the "Low" level), the IO terminal $P_{IO<0>}$ (the first IO terminal) and the IO line $L_{IO<0>}$ (the first IO line), the IO terminal $P_{IO<i>}$ (the i-th IO terminal) and the IO line $L_{IO<i>}$ (the i-th IO line) (herein, i is an integer satisfying 1<i≤8), and the IO terminal $P_{IO<7>}$ (the eighth IO terminal) and the IO line $L_{IO<7>}$ (the eighth IO line) are connected to each other. When the first control signal Sopa is at the second level (the "High" level), the IO terminal $P_{IO<0>}$ (the first IO terminal) and the IO line $L_{IO<7>}$ (the eighth IO line), the IO terminal $P_{IO<i>}$ (the i-th IO terminal) and the IO line $L_{IO<n-i>}$ (the (n-i)-th IO line), and the IO terminal $P_{IO<7>}$ (the eighth IO terminal) and the IO line $L_{IO<0>}$ (the first IO line) are connected to each other.

As illustrated in FIG. 6A, in a case where data in a memory cell of the NAND flash memory 90 is read out and transferred to the controller 91, the read-out data $D_{R<0>}$ to $D_{R<7>}$ is output to the IO terminal $P_{IO<0>}$ to $P_{IO<7>}$, respectively by the second control signal Sopb at the "Low" level (data selection of the first input terminal of the multiplexer).

As illustrated in FIG. 6B, in a case where data in a memory cell of the NAND flash memory 90 is read out and transferred to the controller 91, the read-out data $D_{R<0>}$ is output to the IO terminal $P_{IO<7>}$, the read-out data $D_{R<1>}$ to the IO terminal $P_{IO<6>}$, the read-out data $D_{R<2>}$ to the IO terminal $P_{IO<5>}$, the read-out data $D_{R<3>}$ to the IO terminal $P_{IO<4>}$, the read-out data $D_{R<4>}$ to the IO terminal $P_{10<3>}$, the read-out data $D_{R<5>}$ to the IO terminal $P_{IO<2>}$, the read-out data $D_{R<6>}$ to the IO terminal $P_{IO<1>}$, the read-out data $D_{R<7>}$ to the IO terminal $P_{IO<0>}$, respectively by the second control signal Sopb at the "High" level (data selection of the second input terminal of the multiplexer).

In other words, when the second control signal Sopb is at the first level (the "Low" level), the IO line $L_{IO<0>}$ (the first IO line) and the IO terminal $P_{IO<0>}$ (the first IO terminal), the IO line $L_{IO<i>}$ (the i-th IO line) and the IO terminal $P_{IO<i>}$ (the i-th IO terminal), and the IO line $L_{IO<7>}$ (the eighth IO line) and the IO terminal $P_{IO<7>}$ (the eighth IO terminal) are connected to each other. When the second control signal Sopb is at the second level (the "High" level), the IO line $L_{IO<7>}$ (the eighth IO line) and the IO terminal $P_{IO<0>}$ (the first IO terminal), the IO line $L_{IO<n-i>}$ (the (n-i)-th IO line) and the IO terminal $P_{IO<i>}$ (the i-th IO terminal), and the IO line $L_{IO<0>}$ (the first IO line) and the IO terminal $P_{IO<7>}$ (the eighth IO terminal) are connected to each other.

In the embodiment, in a case where the sequence of the IO terminals of the IO terminal units 60a and 60b of the controller 91 is equal to that of the IO terminal unit 1a of the NAND flash memory 90A and that of the IO terminal unit 1b of the NAND flash memory 90B, the first control signal Sopa and the second control signal Sopb are set to be the first level (the "Low" level), so that the controller 91 can correctly deliver data with the NAND flash memory 90A and the NAND flash memory 90B. In a case where the sequence of the IO terminals of the IO terminal units 60a and 60b of the controller 91 is reversed compared to that of the IO terminal unit 1a of the NAND flash memory 90A and that of the IO terminal unit 1b of the NAND flash memory 90B, the first control signal Sopa and the second control signal Sopb are set to be the second level (the "High" level), so that the controller 91 can correctly deliver data with the NAND flash memory 90A and the NAND flash memory 90B.

Figure 7:
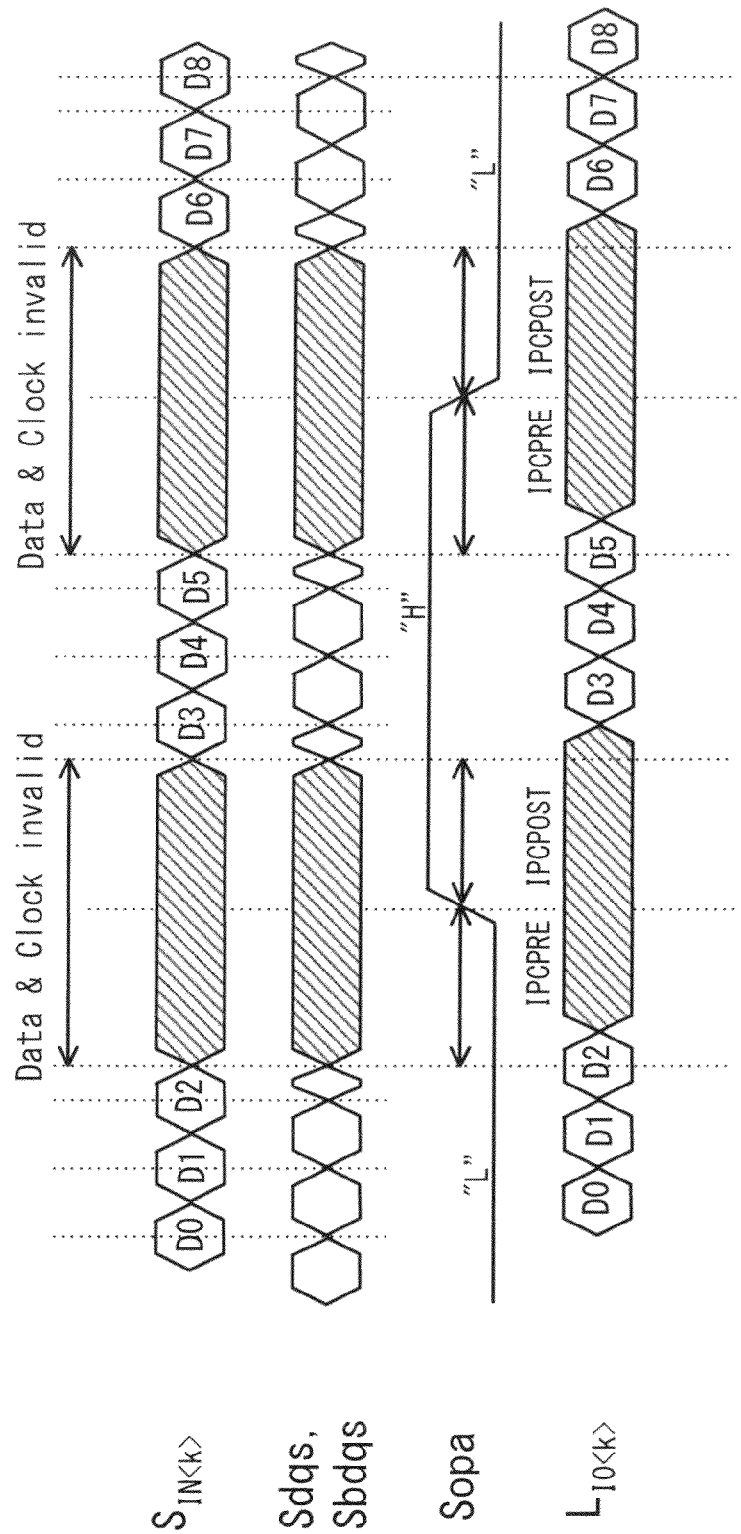
FIG. 7 is a timing chart illustrating a relation between input data and the first control signal according to the first embodiment.

Herein, a relation between the input data and the data of the IO line will be described with reference to FIG. 7. FIG. 7 is a timing chart illustrating a relation among an input data signal $S_{IN<k>}$, a first external data signal Sdqs, a second external data signal Sbdqs, the first control signal Sopa, and the data of the IO line $L_{IO<k>}$. As illustrated in FIG. 7, a "Data & Clock invalid" period during which no input is received from the outside is set in the input data signal $S_{IN<k>}$, the first external data signal Sdqs, and the second external data signal Sbdqs. For example, the "Data & Clock invalid" period is set between the input data D2 and the input data D3 and between the input data D5 and the input data D6, and accordingly also the first external data signal Sdqs and the second external data signal Sbdqs are set with the "Data & Clock invalid" period. The first control signal Sopa is changed in signal level during the "Data & Clock invalid" period. For example, the first control signal Sopa is changed from the "Low" level to the "High" level during the first one of the "Data & Clock invalid" periods, and changed from the "High" level to the "Low" level during the second one of the "Data & Clock invalid" periods. In other words, the change timing of the first control signal Sopa is set not to be matched with the change timing of the input data in order to avoid malfunction which may occur when the change timing of the first control signal Sopa is matched with the change timing of the input data.

Figure 8:
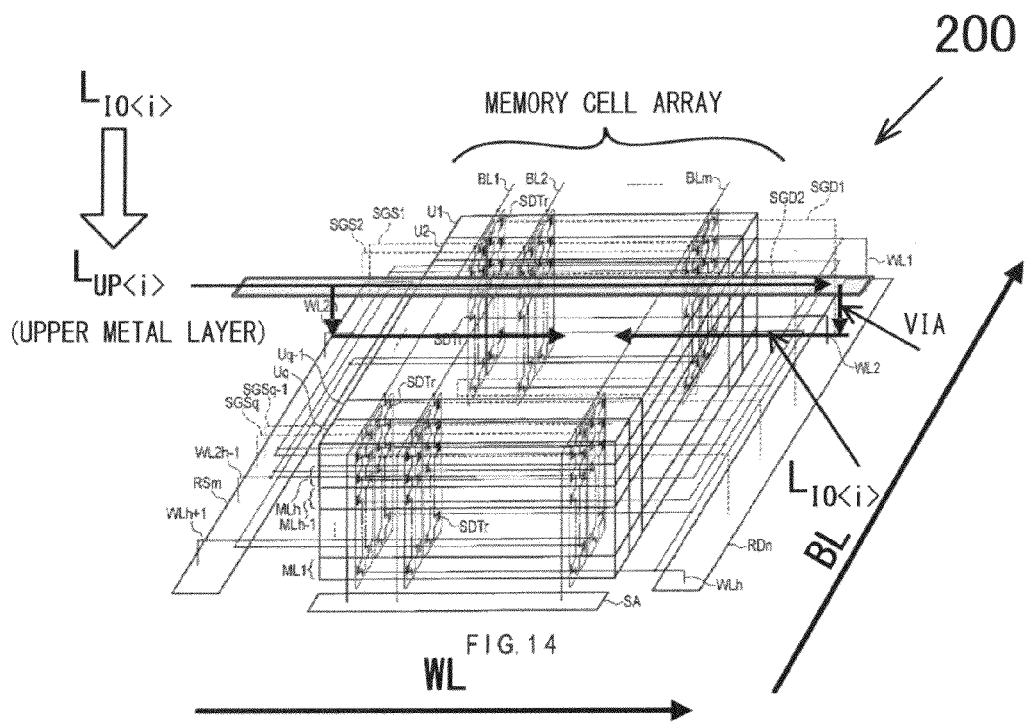
FIG. 8 is a diagram illustrating a configuration of a three dimensional NAND flash memory according to the first embodiment.
Figure 9:
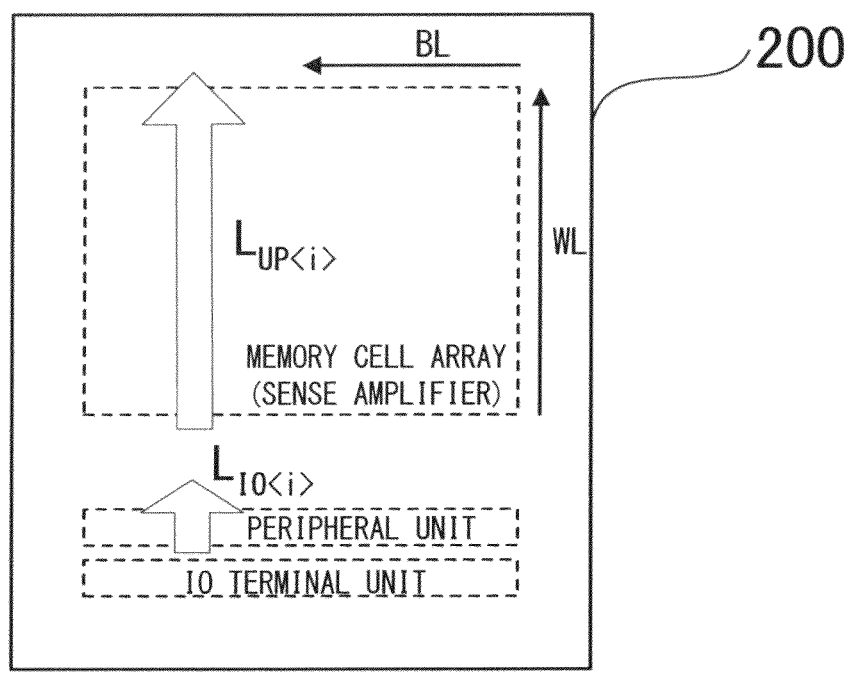
FIG. 9 is a diagram illustrating a relation among a word line, a bit line, an IO line, and an upper layer line in the three dimensional NAND flash memory according to the first embodiment.
Figure 10A:
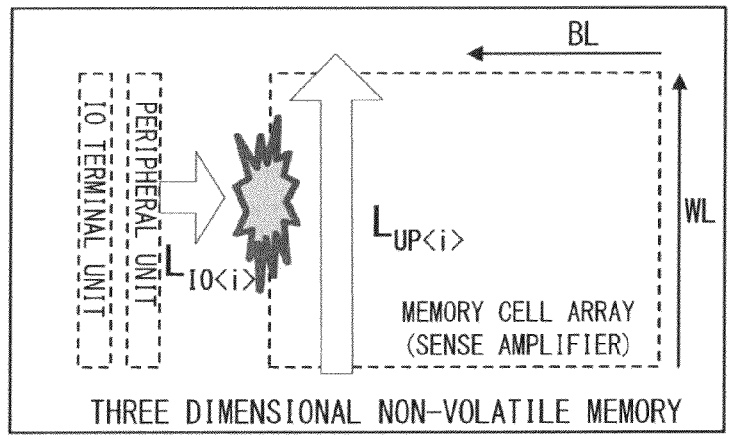
FIG. 10A is a diagram illustrating a relation among a word line, a bit line, an IO line, and an upper layer line in a three dimensional non-volatile memory.
Figure 10B:
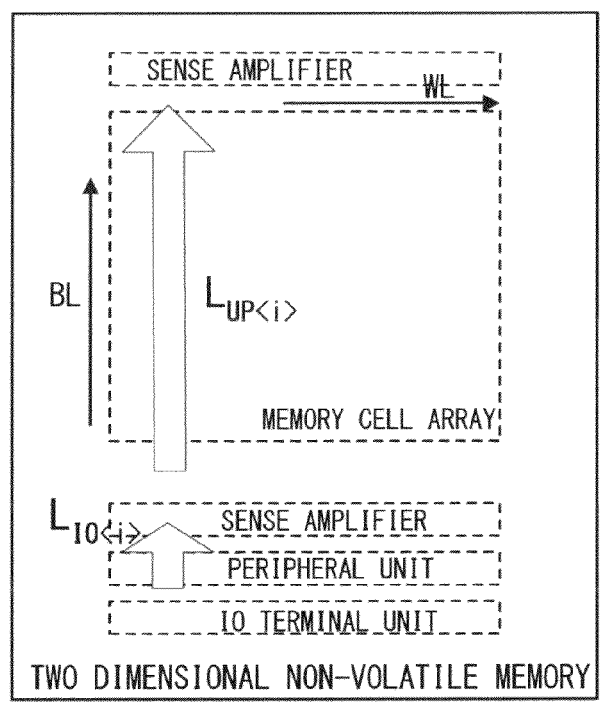
FIG. 10B is a diagram illustrating a relation among a word line, a bit line, an IO line, and an upper layer line in a two dimensional non-volatile memory.

Next, a configuration of a non-volatile semiconductor memory device will be described with reference to FIGS. 8 to 10. FIG. 8 is a diagram illustrating a configuration of a three dimensional NAND flash memory. FIG. 9 is a diagram illustrating a relation among a word line, a bit line, an IO line, and an upper layer line in the three dimensional NAND flash memory. FIG. 10A is a diagram illustrating a relation among a word line, a bit line, an IO line, and an upper layer line in a three dimensional non-volatile memory, and FIG. 10B is a diagram illustrating a relation among a word line, a bit line, an IO line, and an upper layer line in a two dimensional non-volatile memory. Herein, the three dimensional NAND flash memory illustrated in FIGS. 8 and 9 has a bit cost scalable (BiCS) structure, but may have another three dimensional NAND structure or may be a three dimensional non-volatile semiconductor memory device.

As illustrated in FIG. 8, a three dimensional NAND flash memory 200 is configured to include a sense amplifier S/A which is formed on a silicon substrate (not illustrated). A memory cell array having a plurality of memory cells is formed on the sense amplifier S/A. On the memory cell array, a plurality of bit lines BL are disposed in parallel from the front side to the rear side in the drawing. A row decoder is disposed on either side of the memory cell array. In the memory cell array, a plurality of word lines WL are disposed in parallel in the horizontal direction of the drawing. The word lines WL are connected to the row decoder. The IO line $L_{IO<i>}$ is connected to an upper layer line $L_{UP<i>}$ which is formed on the memory cell array and the row decoder. The upper layer line $L_{UP<i>}$ is a line which is disposed in parallel with the word lines WL and present in a layer upper than the bit lines BL formed on the memory cell array.

The delivering of data between the IO terminal $P_{IO<i>}$ and the sense amplifier (for example, reading data from a memory cell and writing data to a memory cell) is performed through the IO line $L_{IO<i>}$, the upper layer line $L_{UP<i>}$, a VIA, and a lower layer line $L_{L<i>}$.

As illustrated in FIG. 9, the three dimensional NAND flash memory 200 includes the IO terminal unit and a peripheral unit. The IO line $L_{IO<i>}$ and the upper layer line $L_{UP<i>}$ are disposed in the vertical direction with respect to the IO terminal unit and the peripheral unit. The IO line $L_{IO<i>}$ and the upper layer line $L_{UP<i>}$ are disposed in parallel with the word line WL, and are disposed in vertical direction with respect to the bit line.

As illustrated in FIG. 10A, in a case where the three dimensional non-volatile memory such as the three dimensional NAND flash memory 200 is disposed differently from that illustrated in FIGS. 8 and 9 (for example, the case of rotating the memory cell array by 90 degrees), the IO line $L_{IO<i>}$ is disposed in a direction perpendicular to the word line WL and the upper layer line $L_{UP<i>}$. As a result, the power line and the signal line from the peripheral unit come to cross over the upper layer line $L_{UP<i>}$ on the memory cell array. Therefore, the design of the three dimensional non-volatile memory will be considerably difficult. For example, a need to newly add a VIA or an upper layer line of the upper layer line $L_{UP<i>}$ may be arisen, which causes an increase in cost and design time for the three dimensional non-volatile memory.

As illustrated in FIG. 10B, the two dimensional non-volatile memory includes the sense amplifiers in the upper and lower portions of the memory cell array, for example. The word line WL is disposed in the horizontal direction of the drawing. The bit line BL is disposed in the vertical direction of the drawing. The IO line $L_{IO<i>}$ and the upper layer line $L_{UP<i>}$ are disposed in a direction perpendicular to the IO terminal unit, the peripheral unit, and the sense amplifier. The IO line $L_{IO<i>}$ is disposed in a direction perpendicular to the word line WL, and is disposed in parallel with the bit line BL.

As described above, the two dimensional non-volatile memory and the three dimensional non-volatile memory are different from each other in the arrangement direction of the IO line $L_{IO<i>}$ and the upper layer line $L_{UP<i>}$, and in the arrangement direction of the word line WL and the bit line BL.

The NAND flash memory 90 according to the embodiment is provided with the IO switch unit 2a which can switch the sequence of the IO lines. Therefore, there is no need to switch the sequence of the IO terminals regardless of whether the NAND flash memory 90 is the two dimensional non-volatile memory or the three dimensional non-volatile memory. The same package can be used regardless of whether the NAND flash memory 90 is the two dimensional non-volatile memory or the three dimensional non-volatile memory. In addition, this can be applied to even a case where the sequence of the IO terminals of the controller 91 is switched.

Further, the embodiment has been described about the configuration that the NAND flash memory 90 is provided with the IO switch unit 2a, but the invention is not necessarily limited to such a configuration. Other non-volatile memories and a semiconductor device with a plurality of IO terminals, and the like, can also be applied. The IO switch unit 2a may be configured as a separated chip.

In addition, the embodiment can be applied to a thin small outline package (TSOP), a land grid array (LGA), a multi-chip package (MCP) which is formed by stacking a plurality of memory chips, and the like.

In addition, the embodiment has been described about the configuration that the first control signal Sopa input from the outside is directly input to the first multiplexer unit 50a and the second control signal Sopb input from the outside is directly input to the second multiplexer unit 50b, but the embodiment is not necessarily limited to such a configuration. For example, first information stored in a ROM and the first control signal Sopa are subjected to a logical operation process, and the result of the logical operation process may be input to the first multiplexer unit 50a. Further, second information stored in the ROM and the second control signal Sopb is subjected to the logical operation process, and the result of the logical operation process may be input to the second multiplexer unit 50b.

A configuration of the memory cell array is mentioned, for example, in U.S. patent application Ser. No. 12/407,403 filed on Mar. 19, 2009 and entitled "THREE DIMENSIONAL STACKED NONVOLATILE SEMICONDUCTOR MEMORY" Further, such a configuration is mentioned in U.S. patent application Ser. No. 12/406,524 filed on Mar. 18, 2009 and entitled "THREE DIMENSIONAL STACKED NONVOLATILE SEMICONDUCTOR MEMORY," U.S. patent application Ser. No. 12/679,991 filed on Mar. 25, 2010 and entitled "NON-VOLATILE SEMICONDUCTOR MEMORY DEVICE AND METHOD OF MANUFACTURING THE SAME," and U.S. patent application Ser. No. 12/532,030 filed on Mar. 23, 2009 and entitled "SEMICONDUCTOR MEMORY AND METHOD FOR MANUFACTURING SAME." The entire contents of these patent applications are incorporated herein by reference.

Figure 11:
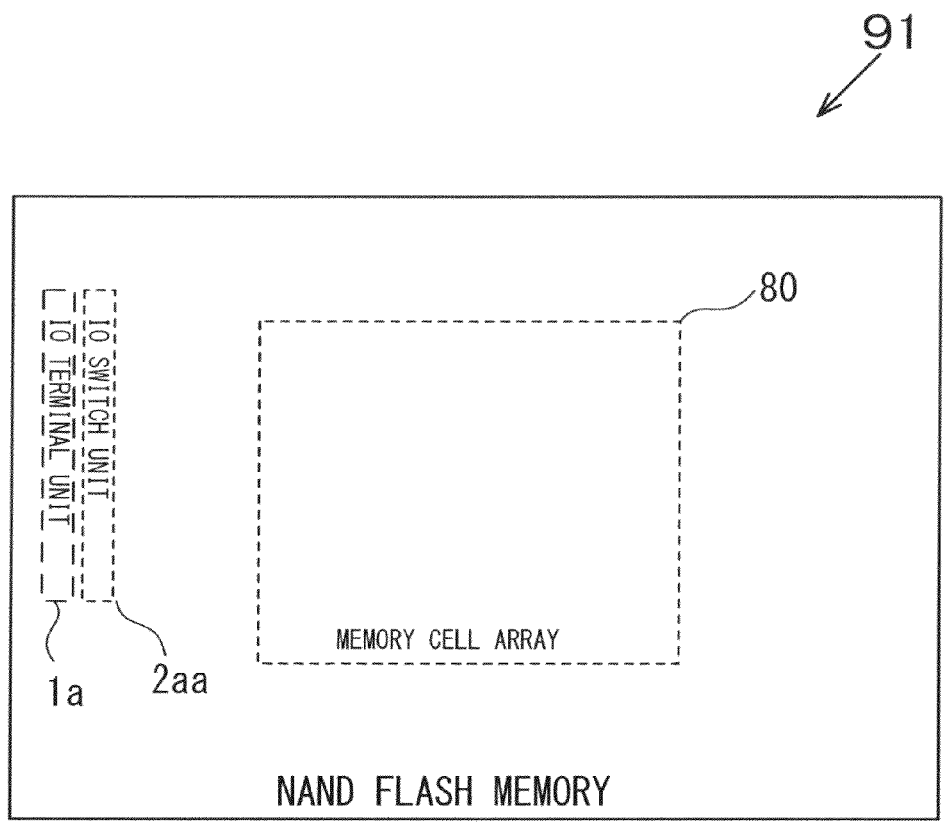
FIG. 11 is a diagram illustrating a schematic configuration of a NAND flash memory according to a second embodiment.

A semiconductor memory device according to a second embodiment will be described with reference to the drawings. The semiconductor memory device according to the embodiment is a NAND flash memory. FIG. 11 is a diagram illustrating a schematic configuration of the NAND flash memory.

Hereinafter, the same components as those of the first embodiment will be denoted with the same reference numerals, and the description will be made only on the different components but not the same components.

As illustrated in FIG. 11, a NAND flash memory 91 includes the IO terminal unit 1a, an IO switch unit 2aa, and the memory cell array 80.

The non-volatile semiconductor memory device such as the NAND flash memory receives data through the IO terminal such as commands and write data. The high-speed paths are strongly requested for the write data. The multiplexers and the like of the first embodiment cause a delay in transfer speed of the write data.

Figure 12:
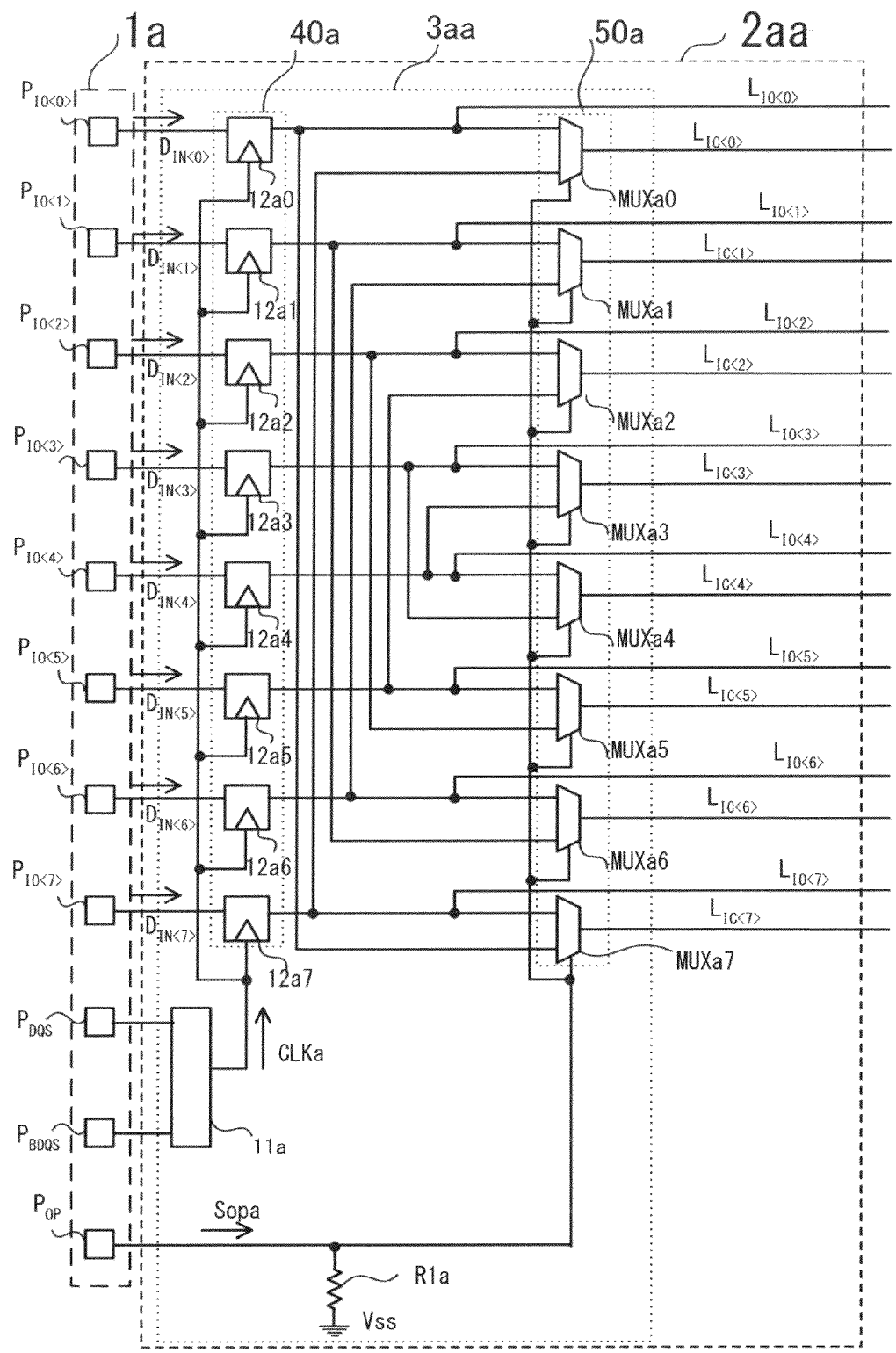
FIG. 12 is a circuit diagram illustrating a configuration of an IO terminal unit and an IO switch unit according to the second embodiment.

For this reason, as illustrated in FIG. 12, the NAND flash memory 91 according to the embodiment transfers the write data using the IO lines without passing through the multiplexers when the input data is the write data, in which the connection sequence of the IO lines is not switched. When the input data is a command, the sequence of command input lines is switched through the multiplexers similarly to the first embodiment. Further, the IO output switch unit has the same configuration as that of the first embodiment, and it is not represented in the drawing and the description will not be repeated.

The IO switch unit 2aa includes an IO input switch unit 3aa. The IO input switch unit 3aa does not switch the sequence of the input data in accordance with a transfer destination when the input data is the write data. The IO input switch unit 3aa includes the clock generator 11a, the first register unit 40a, the first multiplexer unit 50a, and the resistor R1a.

The first register unit 40a includes the registers 12a0 to 12a7 (the first to n-th registers). The first multiplexer unit 50a includes the multiplexers MUXa0 to MUXa7 (the first to n-th multiplexers). The spare terminal $P_{op}$ (the first terminal) receives the first control signal Sopa from the outside. The first control signal Sopa is supplied to the first multiplexer unit 50a.

The register 12a0 includes an input side connected to the IO terminal $P_{IO<0>}$, and an output side connected to the multiplexer MUXa0, the multiplexer MUXa7, and the IO line $L_{IO<0>}$. The register 12a1 includes an input side connected to the IO terminal $P_{IO<1>}$, and an output side connected to the multiplexer MUXa1, the multiplexer MUXa6, and the IO line $L_{IO<1>}$. The register 12a2 includes an input side connected to the IO terminal $P_{IO<2>}$, and an output side connected to the multiplexer MUXa2, the multiplexer MUXa5, and the IO line $L_{IO<2>}$. The register 12a3 includes an input side connected to the IO terminal $P_{IO<3>}$, and an output side connected to the multiplexer MUXa3, the multiplexer MUXa4, and the IO line $L_{IO<3>}$. The register 12a4 includes an input side connected to the IO terminal $P_{IO<4>}$, and an output side connected to the multiplexer MUXa4, the multiplexer MUXa3, and the IO line $L_{IO<4>}$. The register 12a5 includes an input side connected to the IO terminal $P_{IO<5>}$, and an output side connected to the multiplexer MUXa5, the multiplexer MUXa2, and the IO line $L_{IO<5>}$. The register 12a6 includes an input side connected to the IO terminal $P_{IO<6>}$, and an output side connected to the multiplexer MUXa6, the multiplexer MUXa1, and the IO line $L_{IO<6>}$. The register 12a7 includes an input side connected to the IO terminal $P_{IO<7>}$, and an output side connected to the multiplexer MUXa7, the multiplexer MUXa0, and the IO line $L_{IO<7>}$.

The multiplexer MUXa0 includes an input side connected to the register 12a0 and the register 12a7, and an output side connected to a command input line $L_{IC<0>}$. The multiplexer MUXa1 includes an input side connected to the register 12a1 and the register 12a6, and an output side connected to a command input line $L_{IC<1>}$. The multiplexer MUXa2 includes an input side connected to the register 12a2 and the register 12a5, and an output side connected to a command input line $L_{IC<2>}$. The multiplexer MUXa3 includes an input side connected to the register 12a3 and the register 12a4, and an output side connected to a command input line $L_{IC<3>}$. The multiplexer MUXa4 includes an input side connected to the register 12a4 and the register 12a3, and an output side connected to a command input line $L_{IC<4>}$. The multiplexer MUXa5 includes an input side connected to the register 12a5 and the register 12a2, and an output side connected to a command input line $L_{IC<5>}$. The multiplexer MUXa6 includes an input side connected to the register 12a6, the register 12a1, and an output side connected to a command input line $L_{IC<6>}$. The multiplexer MUXa7 includes an input side connected to the register 12a7 and the register 12ad0, and an output side connected to a command input line $L_{IC<7>}$.

The register 12a0 includes an input terminal connected to the IO terminal $P_{IO<0>}$ and an output terminal connected to the IO line $L_{IO<0>}$ and to the first input terminal of the multiplexer MUXa0. The register 12a1 includes an input terminal connected to the IO terminal $P_{IO<1>}$ and an output terminal connected to the IO line $L_{IO<1>}$ and to the first input terminal of the multiplexer MUXa1. The register 12a2 includes an input terminal connected to the IO terminal $P_{IO<2>}$ and an output terminal connected to the TO line $L_{IO<2>}$ and to the first input terminal of the multiplexer MUXa2. The register 12a3 includes an input terminal connected to the IO terminal $P_{IO<3>}$ and an output terminal connected to the IO line $L_{IO<3>}$ and to the first input terminal of the multiplexer MUXa3. The register 12a4 includes an input terminal connected to the IO terminal $P_{IO<4>}$ and an output terminal connected to the IO line $P_{IO<4>}$ and to the first input terminal of the multiplexer MUXa4. The register 12a5 includes an input terminal connected to the IO terminal $P_{IO<5>}$ and an output terminal connected to the TO line $L_{IO<5>}$ and to the first input terminal of the multiplexer MUXa5. The register 12a6 includes an input terminal connected to the IO terminal $P_{IO<6>}$ and an output terminal connected to the IO line $L_{IO<6>}$ and to the first input terminal of the multiplexer MUXa6. The register 12a7 includes an input terminal connected to the IO terminal $P_{IO<7>}$ and an output terminal connected to the IO line $L_{IO<7>}$ and to the first input terminal of the multiplexer MUXa7.

The multiplexer MUXa0 includes the first input terminal connected to the output terminal of the register 12a0 and the second input terminal connected to the output terminal of the register 12a7, and selects data of the register 12a0 or the register 12a7 by the first control signal Sopa (at the first level or the second level having a different voltage level from the first level) to output the data to the command input line $L_{IC<0>}$. Herein, in a case where the first level is the High level, the second level becomes Low level, and in a case where the first level is the Low level, the second level becomes the High level. The multiplexer MUXa1 includes the first input terminal connected to the output terminal of the register 12a1 and the second input terminal connected to the output terminal of the register 12a6, and selects data of the register 12a1 or the register 12a6 by the first control signal Sopa to output the data to the command input line $L_{IC<1>}$. The multiplexer MUXa2 includes the first input terminal connected to the output terminal of the register 12a2 and the second input terminal connected to the output terminal of the register 12a5, and selects data of the register 12a2 or the register 12a5 by the first control signal Sopa to output the data to the command input line $L_{IC<2>}$. The multiplexer MUXa3 includes the first input terminal connected to the output terminal of the register 12a3 and the second input terminal connected to the output terminal of the register 12a4, and selects data of the register 12a3 or the register 12a4 by the first control signal Sopa to output the data to the command input line $L_{IC<3>}$. The multiplexer MUXa4 includes the first input terminal connected to the output terminal of the register 12a4 and the second input terminal connected to the output terminal of the register 12a3, and selects data of the register 12a4 or the register 12a3 by the first control signal Sopa to output the data to the command input line $L_{IC<4>}$. The multiplexer MUXa5 includes the first input terminal connected to the output terminal of the register 12a5 and the second input terminal connected to the output terminal of the register 12a2, and selects data of the register 12a5 or the register 12a2 by the first control signal Sopa to output the data to the command input line $L_{IC<5>}$. The multiplexer MUXa6 includes the first input terminal connected to the output terminal of the register 12a6 and the second input terminal connected to the output terminal of the register 12a1, and selects data of the register 12a6 or the register 12a1 by the first control signal Sopa to output the data to the command input line $L_{IC<6>}$. The multiplexer MUXa7 includes the first input terminal connected to the output terminal of the register 12a7 and the second input terminal connected to the output terminal of the register 12a0, and selects data of the register 12a7 or the register 12a0 by the first control signal Sopa to output the data to the command input line $L_{IC<7>}$.

Figure 14A:
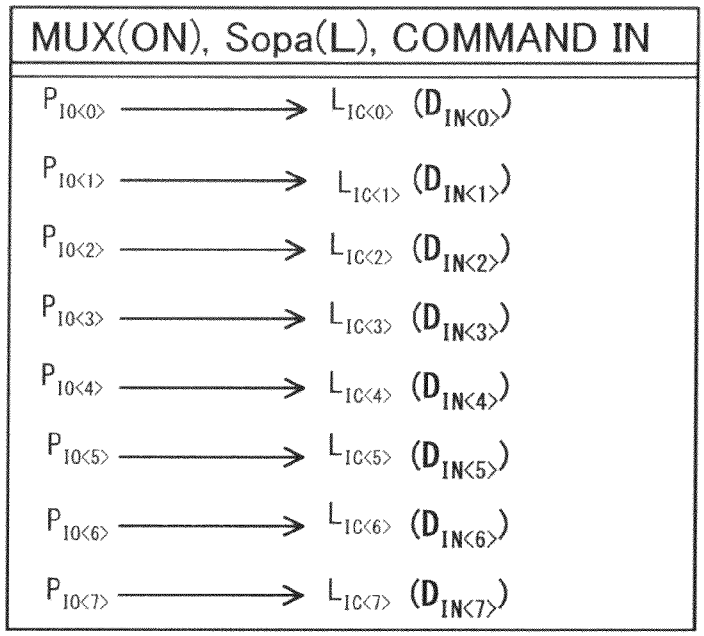
FIG. 14A is a diagram for describing a connection state between the IO terminals and the IO lines and between the IO terminals and command input lines when the multiplexers are turned on, in a case where the first control signal is at the first level.
Figure 14B:
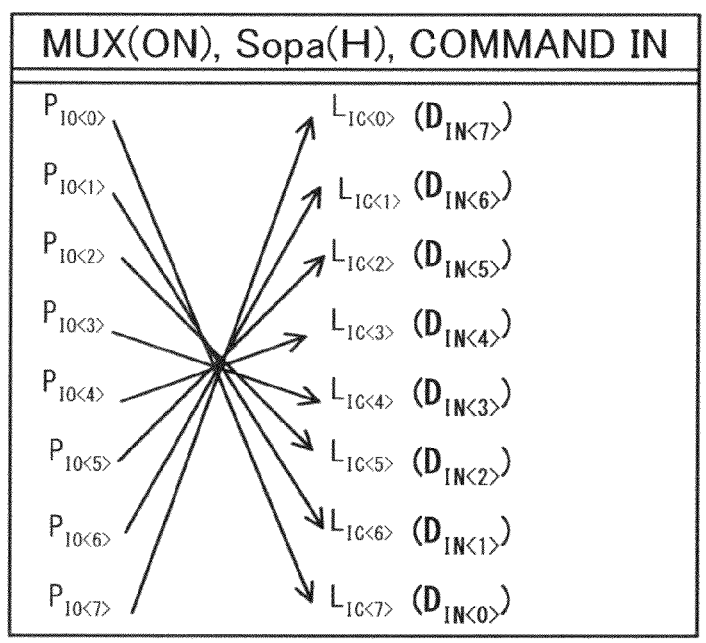
FIG. 14B is a diagram for describing a connection state between the IO terminals and the IO lines and between the IO terminals and the command input lines when the multiplexers are turned on, in a case where the first control signal is at the second level.

A specific operation will be described with reference to FIGS. 13 and 14. FIG. 13 is a diagram for describing a connection state between the IO terminals and the IO lines when the first multiplexer unit 50a is turned off. FIG. 14A is a diagram for describing a connection state between the IO terminals and the command input lines when the first multiplexer unit 50a is turned on, in a case where the first control signal is at the first level. FIG. 14B is a diagram for describing a connection state between the IO terminals and the command input lines when the first multiplexer unit 50a is turned on, in a case where the first control signal is at the second level. Herein, turning off the first multiplexer unit 50a means that the power is not supplied and thus the operation process is not performed even though the first control signal is input.

As illustrated in FIG. 13, in a case where the write data is input to the NAND flash memory 91, the first multiplexer unit 50a is turned off, and the input data $D_{IN<0>}$ to $D_{IN<7>}$ is transferred to the IO line $L_{IO<0>}$ to $L_{IO<7>}$, respectively. At the time, the write data is transferred to the IO lines only through the registers. Therefore, the signal delay can be significantly reduced.

As illustrated in FIG. 14A, in a case where the command is input to the NAND flash memory 91, the first multiplexer unit 50a is turned on, and the input data $D_{IN<0>}$ to $D_{IN<7>}$ is transferred to the command input lines $L_{IC<0>}$ to $L_{IC<7>}$, respectively by the first control signal Sopa at the "Low" level (data selection of the first input terminal of the multiplexer).

As illustrated in FIG. 14B, in a case where the command is input to the NAND flash memory 91, the first multiplexer unit 50a is turned on, and respectively transfers the input data $D_{IN<0>}$ to the command input line $L_{IC<7>}$,
the input data $D_{IN<1>}$ to the command input line $L_{IC<6>}$,
the input data $D_{IN<2>}$ to the command input line $L_{IC<5>}$,
the input data $D_{IN<3>}$ to the command input line $L_{IC<4>}$,
the input data $D_{IN<4>}$ to the command input line $L_{IC<3>}$,
the input data $D_{IN<5>}$ to the command input line $L_{IC<2>}$,
the input data $D_{IN<6>}$ to the command input line $L_{IC<1>}$, and
the input data $D_{IN<7>}$ to the command input line $L_{IC<0>}$ by the first control signal Sopa at the "High" level (data selection of the second input terminal of the multiplexer).

The NAND flash memory 91 according to the embodiment includes the IO switch unit 2aa which does not switch the sequence of data to be transferred to the IO lines when the write data is input, and switches the sequence of data to be transferred to the command input lines when the command data is input. Therefore, in addition to the same advantage as that of the first embodiment, it is possible to transfer the data at a high speed when the write data is input compared to the first embodiment.

In above embodiments, the words of "connect" include "electrically connect", not only "physically connect" or "directly connect".

Several embodiments according to the invention have been described, but these embodiments are presented as examples, which are not intended to limit the scope of the invention. These novel embodiments can be implemented in various other forms, and various omissions, substitutions, and changes can be made in a scope not departing from the spirit of the invention. These embodiments and the modifications are included in the scope or spirit of the invention, and also in the equivalent scope of claims of the invention.

What is claimed is:

1. A semiconductor device comprising:
   an IO terminal unit including first and second IO terminals;
   a first IO line configured to be electrically connected to one of both the first IO terminal and the second IO terminal;
   a second IO line configured to be electrically connected to the other of both the first IO terminal and the second IO terminal; and
   an IO switch unit provided between the first and second IO terminals and the first and second IO lines, the IO switch unit including an input switch unit with a first register unit, the first register unit including first and second registers, each of the first and second registers configured to receive a first clock generated based on external data and to output input data through each of the first and second IO terminals,
   wherein when the semiconductor device receives a first signal from outside, the IO switch unit connects the first IO terminal to the first IO line, and the second IO terminal to the second IO line, and when the semiconductor device receives a second signal from outside, the IO switch unit connects the first IO terminal to the second IO line, and the second IO terminal to the first IO line, and wherein the second signal is different from the first signal.

2. The semiconductor device according to claim 1, wherein the input switch unit includes a first multiplexer unit, the first multiplexer unit includes first and second multiplexers, and the first and second multiplexers are electrically connected to the first and second registers, each of the first and second multiplexers connects the first IO terminal to the first IO line, and the second IO terminal to the second IO line based on the first signal, and each of the first and second multiplexers connects the first IO terminal to the second IO line, and the second IO terminal to the first IO line based on the second signal.

3. The semiconductor device according to claim 2, further comprising:
a first input data terminal;
a second input data terminal; and
a clock generator, wherein
the first input data terminal receives first external data,
the second input data terminal receives second external data different from the first external data, and
the clock generator generates the first clock based on the first and second external data.

4. The semiconductor device according to claim 2, wherein the first and second signals are input from the outside through a first terminal.

5. The semiconductor device according to claim 2, wherein when the first signal is a "Low" level, the second signal becomes a "High" level.

6. The semiconductor device according to claim 2, wherein the IO switch unit includes an output switch unit including a second register unit and a second multiplexer unit,
the second register unit includes third and fourth registers,
the third and fourth registers are electrically connected to the first and second IO lines, each of the third and fourth registers receives a second clock generated in the IO switch unit and outputs data to be transferred from the first and second IO lines,
the second multiplexer unit includes third and fourth multiplexers, and
the third and fourth multiplexers are electrically connected to the third and fourth registers, each of the third and fourth multiplexers makes an electrical connection between the first IO terminal and the first IO line, and between the second terminal and the second IO line based on a third signal, and each of the third and fourth multiplexers makes an electrical connection between the first IO terminal and the second IO line, and between the second terminal and the first IO line based on a fourth signal, wherein the fourth signal is different from the third signal.

7. The semiconductor device according to claim 6, wherein the first and second signals are input from the outside through a first terminal.

8. The semiconductor device according to claim 6, wherein when the first signal is a "Low" level, the second signal becomes a "High" level.

9. A semiconductor memory device comprising:
an IO terminal unit including first to n-th IO terminals (herein, n is an integer of 2 or more);
first to n-th IO lines configured to be electrically connected to the first to n-th IO terminals;
first to n-th command input lines configured to be electrically connected to the first to n-th IO terminals;
a memory cell array configured to be electrically connected to the first to n-th IO lines and the first to n-th command input lines; and
an IO switch unit provided among the first to n-th IO terminals, the first to n-th IO lines, and the first to n-th command input lines, the IO switch unit including an input switch unit including a first register unit, the first register unit including first to n-th registers, first to n-th command input lines configured to be electrically connected to the first to n-th IO terminals, the first to n-th registers are electrically connected to the first to n-th IO terminals, each of the first to n-th registers receives a first clock generated based on external data and outputs data input through the first to n-th IO terminals to the first to n-th IO lines and to the first to n-th command input lines,
wherein when write data is input, the first IO terminal is electrically connected to the first IO line and an i-th IO terminal (herein, i is an integer satisfying 1<i≤n) is electrically connected to an i-th IO line to transfer the write data,
when a control signal is a first level, the IO switch unit makes an electrical connection between the first IO terminal and the first command input line, and between the i-th IO terminal and the i-th command input line, and
when the control signal is a second level, the IO switch unit connects the first IO terminal to the n-th command input line, the i-th IO terminal to an (n−i)-th command input line, and the n-th IO terminal to the first command input line, the second level being different from the first level.

10. The semiconductor memory device according to claim 9, wherein
the input switch unit includes a first multiplexer unit,
the first multiplexer unit includes first to n-th multiplexers,
the first to n-th multiplexers are electrically connected to the first to n-th registers, each of the first to n-th multiplexers makes an electrical connection between the first IO terminal and the first command input line, and between the i-th IO terminal and an i-th command input line to transfer command data when a first control signal is at the first level, and makes an electrical connection between the first IO terminal and the n-th command input line, between the i-th IO terminal and the (n−i)-th command input line, and between the n-th IO terminal and the first command input line to transfer the command data when the first control signal is at the second level having a different voltage level from the first level, and
the IO switch unit makes an electrical connection between the first IO terminal and the first IO line, and between the i-th IO terminal and the i-th IO line to transfer the write data when the first multiplexer unit is turned off.

11. The semiconductor memory device according to claim 10, further comprising:
a first input data terminal;
a second input data terminal; and
a clock generator, wherein
the first input data terminal receives first external data,
the second input data terminal receives second external data different from the first external data, and
the clock generator generates the first clock based on the first and second external data.

12. The semiconductor memory device according to claim 10, wherein
the first control signal is input from the outside through a first terminal.

13. The semiconductor memory device according to claim 10, wherein
when the first level of the first control signal is a "Low" level, the second level becomes a "High" level.

14. The semiconductor memory device according to claim 9, wherein
the first to n-th IO terminals are disposed in parallel with a word line.

* * * * *